United States Patent [19]

Heremans et al.

[11] Patent Number: 6,075,437
[45] Date of Patent: *Jun. 13, 2000

[54] IN-PLANE MAGNETORESISTANCE BRIDGE

[75] Inventors: Joseph Pierre Heremans, Troy, Mich.; Jihui Yang, Windsor, Canada

[73] Assignee: General Motors Corporation, Detroit, Mich.

[*] Notice: This patent issued on a continued prosecution application filed under 37 CFR 1.53(d), and is subject to the twenty year patent term provisions of 35 U.S.C. 154(a)(2).

[21] Appl. No.: 09/036,798

[22] Filed: Mar. 9, 1998

[51] Int. Cl.$^7$ ..................................................... H01L 43/00
[52] U.S. Cl. .......................................... 338/32 R; 338/324
[58] Field of Search .................................. 338/324, 32 R, 338/252, 323, 325, 328

[56] References Cited

U.S. PATENT DOCUMENTS

| | | | |
|---|---|---|---|
| 3,781,750 | 12/1973 | Takiguchi | 338/32 R |
| 5,038,131 | 8/1991 | Olk et al. | 338/32 R |
| 5,184,106 | 2/1993 | Partin et al. | 338/32 R |
| 5,491,461 | 2/1996 | Partin et al. | 338/32 R |
| 5,621,320 | 4/1997 | Yokotani et al. | 324/252 |

OTHER PUBLICATIONS

Bergman et al, "Calculation of Strong–Field Magnetoresistance in Some Periodic Composites," *Physical Review B*, vol. 49, No. 23, Jun. 15, 1994, pp. 16 256–16 268.

Bergman et al, "Strong–Field Magnetoresistance Anisotropy in Thin Composite Films with a Periodic Microstructure," *Physical Review B*, vol. 51, No. 19, May 15, 1995, pp. 13845–13 848.

Strelniker et al, "Interference of Current Distortion Patterns and Magnetoresistance Anisotropy in a Composite with Periodic Microstructure," *Physical Review B*, vol. 53, No. 15, Apr. 15, 1996, pp. 1–9.

Strelniker et al, "Theory of Magnetotransport in a Composite Medium with Periodic Microstructure for Arbitrary Magnetic Fields," *Physical Review B*, vol. 50, No. 19, Nov. 15, 1994, pp. 14 001–14 015.

Tornow et al, "Anisotropic Magnetoresistance of a Classical Antidot Array," *Physical Review Letters*, vol. 77, No. 1, Jul. 1 1996, pp. 147–150.

*Primary Examiner*—Lincoln Donovan
*Assistant Examiner*—Richard K. Lee
*Attorney, Agent, or Firm*—Margaret A. Dobrowitsky

[57] ABSTRACT

A magnetic field sensor device is disclosed comprising two substantially identical n-doped, high carrier mobility semiconductor films (e.g., InSb films) each containing a pattern of cylindrical holes or antidots that cause the resistance of the respective films to vary depending upon the direction of the in-plane component of an applied magnetic field.

10 Claims, 4 Drawing Sheets

IN-PLANE MAGNETORESISTANCE BRIDGE

TECHNICAL FIELD

This invention pertains to magnetic field sensors. More particularly, this invention pertains to high carrier mobility, doped semiconductor films that are made sensitive to the modulation of the direction or magnitude of the in-plane component of a magnetic field by an embedded periodic antidot array.

BACKGROUND OF THE INVENTION

Magnetic position sensors find application in a number of industrial fields including especially automobiles. In automobiles, magnetic position sensors are employed to detect crankshaft position and the like. They comprise a permanent magnet, a moving ferromagnetic target and a magnetic field sensor. The ferromagnetic target moving through the field of the permanent magnet causes a modulation of the magnetic field in the region of the magnetic field sensor. The varying magnetic field is detected and is used as a basis for determining the position of some component to which the moving target may be affixed.

Many applications of magnetic position sensors use the modulation of the magnetic field component that is normal to the plane of the magnetic sensor. Conventional Hall sensors and semiconductor magnetoresistors are suitable for such applications because these sensors are responsive to the normal magnetic field component. However, there are some applications in which the geometrical application of the sensor would favor the use of a magnetic sensor, which is sensitive to modulation of the magnetic field component in the plane of the magnetic sensor. In these applications, of course, conventional Hall sensors and present semiconductor film magnetoresistors are unsuitable.

Publications by David J. Bergman et al over the period of 1994 through 1996 first predicted and then demonstrated that inhomogeneities in a conductive film such as a periodic array of small cylindrical voids (antidots) embedded in a thin film of n-doped GaAs caused a pronounced anisotropy of magnetoresistance. In the Bergman et al work where the magnetic field lies in the plane of the GaAs film, a resistivity dependence on the angle between the in-plane magnetic field and an electrical current passed through the film was observed. In the experimental portion of the work, which was reported in Bergman et al, *Phys. Rev. Lett.*, 77, 147 (1996), the observed magnetoresistance anisotropy effect was observed at a low temperature, 90 K, and a very strong magnetic field, B>4 Tesla.

It would now be desirable to devise a sensitive galvanomagnetic device that would be useful at normal room temperature and over the temperature range found in automotive applications, for example. Furthermore, it would be useful to adapt such a device to provide useful information in a magnetic position sensor combination.

SUMMARY OF THE INVENTION

This invention provides a practical semiconductor magnetoresistor device that is sensitive at ambient temperature to the modulation of the component of a magnetic field that lies in the plane of the semiconductor film. This new magnetic field sensing device utilizes a magnetoresistance bridge arrangement that increases the angular or amplitude sensitivity of a pair of antidot-embedded semiconductor films and can also compensate for temperature or otherwise induced drifts in the change in the resistivity of the films with the change in the angle of the in-plane magnetic field.

The invention utilizes thin films of suitable narrow energy band gap semiconductor material that has been doped to have high carrier mobility. Preferably, the semiconductor films have a carrier mobility of at least 10,000 $cm^2/V\cdot s$ at room temperature. Furthermore, this invention utilizes substantially identical pairs of such films in which are embedded periodic arrays of antidot structures. An example of a suitable antidot structure is a periodic array of cylindrical voids or holes etched or otherwise embedded in a thin film of semiconductor material. Examples of preferred semiconductor materials are n-doped films of indium antimonide or indium arsenide. These films are supplied on a substrate material that does not interfere with the detection of the magnetic field and that is sufficiently insulating so that the current is confined to the n-doped film.

The introduction of the periodic antidot arrays in the semiconductor films constitutes the kind of inhomogeneities that are described in the work of Bergman et al. When a constant current is passed in a given direction through the film including such antidot arrays, it is found that the resistivity of the film varies depending upon the direction of the in-plane component of the magnetic field acting on the film. In accordance with the invention, one or more pairs of such films are employed in a half or full Wheatstone bridge arrangement. The antidot-embedded films may be carried on a non-doped substrate of the same material. However it is preferable to use a substrate of another III-V compound with a larger resistivity such as gallium arsenide (GaAs) or indium phosphide (InP). Electrical leads are formed adjacent to the films so that a suitable current is produced through the two films.

The films and leads are arranged so that the current direction through the first film is perpendicular to the direction of the current through the second film. When the direction of the in-plane component of a magnetic field (B) changes with respect to the current (I) directions in the two antidot array-containing films, their respective electrical resistivities vary in a way that may be utilized to determine the angle ($\alpha$) between the direction of the in-plane magnetic field and the direction of the current flow. The resistivities are suitably measured, for example, by determining the voltage drop across the semiconductor films in the direction of current flow. As is known, this information may be used to determine the position of a suitable ferromagnetic target attached to a component of interest.

Thus, such a half or full bridge device may be employed in combination with a permanent magnet and a moving electromagnetic target so as to form a suitable position sensor. The subject devices may also be used in magnetic recording applications.

Other objects and advantages of the invention will become more apparent from a detailed description thereof, which follows. Reference will be had to the drawings.

DESCRIPTION OF PREFERRED EMBODIMENTS

Figure 1:
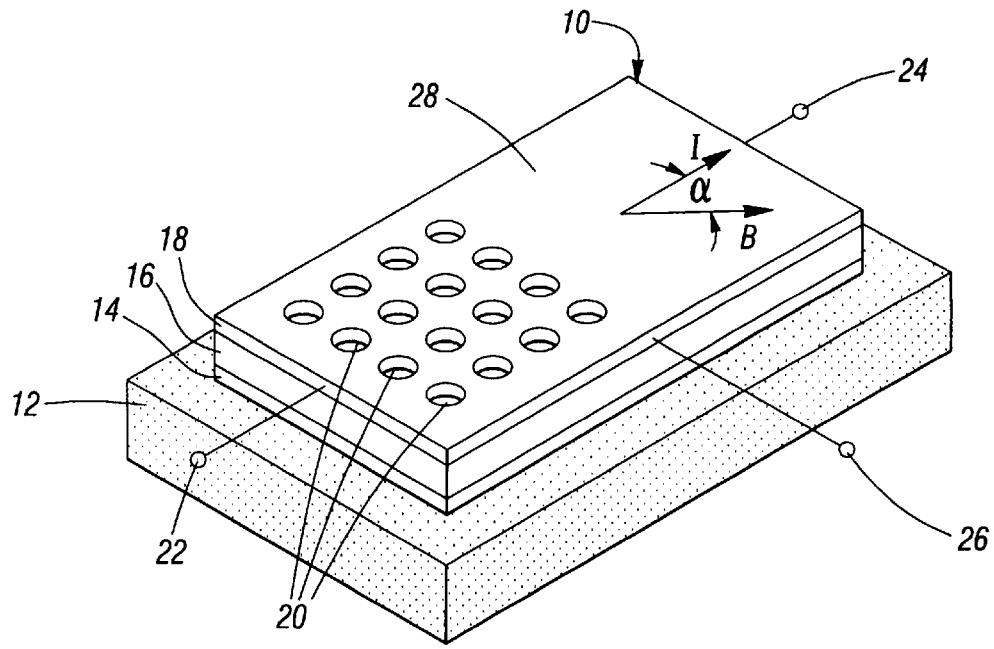
FIG. 1 is a perspective view depicting the geometric configuration of an indium antimonide film sample with an antidot array over approximately half of its surface and with the other half of the surface being unpatterned.

This invention utilizes suitable thin film semiconductor compositions. It is preferred that such films have a suitable number of current carriers and that the compositions display high carrier mobility. Bergman et al predicted that a strong in-plane magnetoresistance anisotropy would be produced under the condition in which $\mu B$ is greater than one, where $\mu$ is the carrier mobility (cm$^2$/V•s) of the semiconductor material and B is the strength of the magnetic field (Tesla). The first experimental verification of this theory was done by Bergman et al using gallium arsenide films embedding periodic antidot arrays. However, because the mobility of the carriers in the gallium arsenide films was only 2500 cm$^2$/V•s at 90 K, the observed magnetoresistance anisotropy effect was limited to low temperature and a very strong magnetic field of greater than 4 Tesla. Accordingly, a preferred semiconductor material for use in the invention is a suitably doped film of indium antimonide, and the practice of the invention will be described in terms of the usage of indium antimonide. However, other suitable high carrier mobility semiconductors may be employed as will be described.

A suitable substrate material for the indium antimonide film device is semi-insulating, undoped gallium arsenide, which is available as a solid body. The thickness of the substrate is suitably about 0.025 inch or 0.64 millimeter. The device may be square or rectangular and of a size suitable to carry one or more indium antimonide film devices as required.

Indium antimonide may be deposited epitaxially on the gallium arsenide substrate using any of the well known epitaxial deposition processes for group III-V semiconductor materials such as vapor phase epitaxy, liquid phase epitaxy, metal organic chemical vapor deposition or molecular beam epitaxy. However, there is some lattice mismatch between the indium antimonide and gallium arsenide, and therefore it is preferred that a buffer layer of indium antimonide be first formed as follows. The indium antimonide buffer layer lying directly on the gallium arsenide substrate is doped with tellurium or other suitable acceptor impurity to a carrier concentration of $2\pm1\times10^{16}$ electrons per cc. The thickness of this indium antimonide buffer layer is preferably about $0.2\pm0.05$ micron. An active layer of indium antimonide is then epitaxially deposited on the buffer layer of indium antimonide. The active layer of antimonide is doped with tellurium (n-type) and grown to a thickness of about 1.5 microns. The n-type doping is such that there is an electron carrier density in the range of $8\times10^{16}$ cm$^{-3}$ to $11\times10^{16}$ cm$^{-3}$. The mobility of these carriers is preferably in the range of 34,000 to 40,000 cm$^2$/V•s at room temperature. Following the growth of the active layer, a very thin contact layer of indium antimonide is formed on top of the active layer. The contact layer is also tellurium doped and is grown to a thickness of about $0.05\pm0.01$ micron. The carrier density in the contact layer is higher to facilitate good electrical contact to a density of $30\pm10^{16}$ electrons per cubic centimeter. The antidots, as will be further described below, are parallelepipedal or cylindrical voids etched through the contact layer and the active layer in selective locations on each appropriate indium antimonide film device area.

While the above-described indium antimonide device is preferred for use in the practice of this invention, other magnetoresistive films of the type described in U.S. Pat. No. 5,184,106, especially at columns 3–5 (incorporated herein by reference), are deemed suitable for use herein.

A first indium antimonide magnetoresistive film device was prepared as described above to determine its room temperature resistivity properties with a varying in-plane magnetic field direction. Thus, the device seen in FIG. 1 in perspective view and greatly enlarged and not-in-size proportion shows an indium antimonide film device 10, approximately 400 micrometers long and 50 micrometers wide by 1.5 micrometers in thickness. Device 10 is deposited on GaAs substrate 12 as described above. Device 10 comprises InSb buffer layer 14, InSb active layer 16 and InSb contact layer 18, all doped with n-type carriers and grown as described above. In the lower half of the film device 10, as depicted in FIG. 1, a 4×4 square block array of cylindrical antidot holes 20 is formed in the film using wet-etch photolithography. These antidots had a hole diameter of 5 μm, and their centers were located at the corners of squares with sides of 12.5 μm. They extend through contact layer 18, active layer 16 and buffer layer 14. Electrical leads 22 and 24 were provided at the ends of the film device 10 for providing a direct electrical current I in the direction from the bottom to the top of FIG. 1. In addition, a side lead 26 was provided to the indium antimonide film, to measure the voltage at that location. Although the leads in FIG. 1 are illustrated schematically as wires, in practice they will be gold or other suitable metallization areas engaging contact layer 18.

The three-layer indium antimonide film device 10 was mounted on a rotating stage inserted into a two Tesla magnet with a magnetic field in the sample plane. Longitudinal resistance $R_a$ (parallel to the current direction, leads 26 and 22) was measured by passing a DC current between 24 and 22 at a constant applied voltage, measuring the voltage between 26 and 22, and then dividing the voltage by the current. As shown by an arrow in the unpatterned portion 28 of the device 10, the current direction I was constant from the bottom to the top of the sample (lead 22 to lead 24) while the in-plane component of the magnetic field B varied as the sample was rotated and as indicated at a particular time at an angle $\alpha$.

The resistance $R_a$ between leads 26 and 22 was thus determined as a function of the angle α (the angle between the current direction and the magnetic field direction) varying from 0 to 90 degrees at a constant magnetic field B of 2 Tesla. All data were taken at room temperature.

Figure 2:
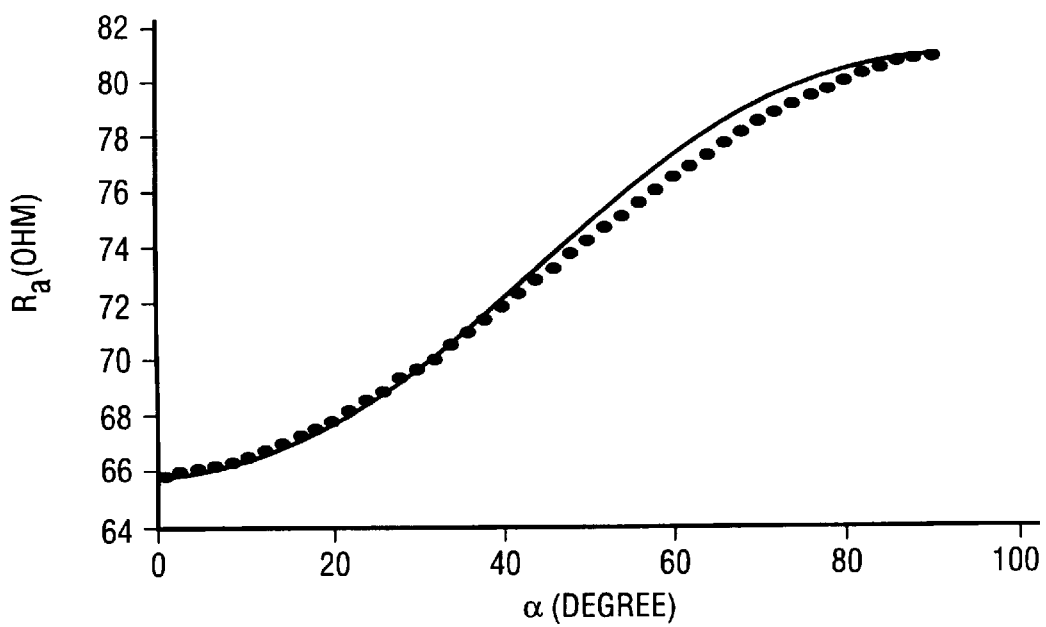
FIG. 2 is a graph of the resistance ($R_a$ in Ohm) of the antidot-embedded part of the indium antimonide film sample of FIG. 1 as the angle ($\alpha$) between the direction of the in-plane component of the magnetic field (B) varies with the current (I) direction. Data is taken at room temperature for $0° \leq \alpha \leq 90°$. The full line is a model equation fitted to the data.

FIG. 2 shows as full dots (●) the measured variation in resistance $R_a$ with α of the antidot-embedded region of the film. The full curve represents a fit through the data of a function $$R_a(\alpha) = R_o + A \sin^2(\alpha)$$

where $R_o = (R_a$ at $\alpha=0) = 65.7$ Ω and A=15.1 Ω. This function has a period of π. The resistance of unpatterned region of the indium antimonide film between contacts 24 and 26 is finite but independent of α. Thus, it is shown that the directional anisotropy of magnetoresistance of the indium antimonide device 10 of FIG. 1 is clearly due to the existence of the antidot array 20.

It appears that the indium antimonide device 10 illustrated in FIG. 1 is the first antidot device displaying in-plane magnetoresistance variation at room temperature. This single film device, however, is not deemed suitable for use as a sensitive magnetic field sensor.

Figure 3:
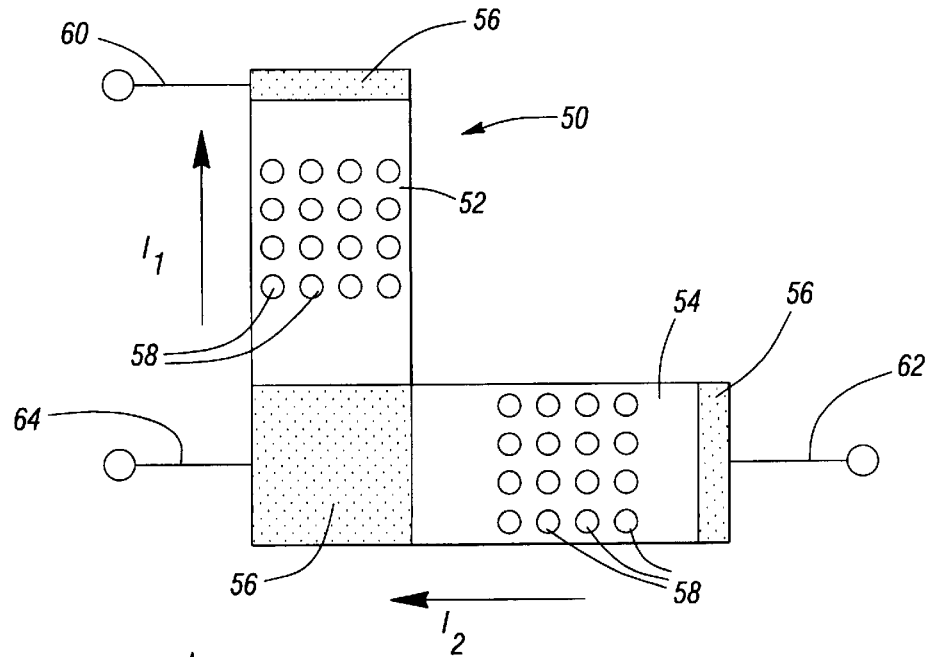
FIG. 3 is a plan view of a half Wheatstone bridge arrangement made using two n-doped indium antimonide semiconductor films containing embedded antidot lattices.

FIG. 3 illustrates the use of a pair of three-layer indium antimonide semiconductor film devices in a half Wheatstone bridge differential sensor arrangement 50. Substantially identical devices 52 and 54 are deposited on a suitable substrate such as gallium arsenide. The surfaces of the substrate material adjacent the ends of InSb devices 52 and 54 are coated with a thin film of conductive contact material 56 such as gold. Each InSb device 52 and 54 is a 50 micron by 50 micron square by 1.5 microns thick. Each has 16 antidot holes 58 formed in a 4×4 square pattern. Each of the holes 58 was formed by a wet-etch photolithographic process. The centers of the holes 58 were located 12.5 μm apart, and the diameter of each hole 58 was 6 μm. The holes extended through the n-doped three-layer indium antimonide film devices 52 and 54. Electrical leads 60, 62 and 64 are respectively connected so that leads 62 and 64 can conduct current in the direction of $I_2$ through device 54 and leads 64 and 60 can conduct current to $I_1$ in the direction indicated through film device 52. The directions of current flow in the two sensors are thus perpendicular to each other as summarized and illustrated in the current-magnetic field diagram 66 below the sensor device 50.

Referring to the current-magnetic field diagram 66, it is seen that the current flow $I_1$ through film 52 and the current flow $I_2$ through film 54 are perpendicular to each other, no matter what the direction of an in-plane magnetic field B. The angles between the field B and the two current lines $I_1$ and $I_2$ will differ by 90 degrees.

It was shown in FIG. 2 that the change in resistivity of an antidot patterned semiconductor film continuously increases as α increases from 0 to 90°. The resistivity then decreases as α increases from 90° to 180°, and then the function repeats itself. By combining the resistivities of at least two antidot patterned semiconductor films offset at 90°, the resistivity of one of the two films is increasing while the resistivity of the other film may be decreasing. The combined effect is increased sensitivity of a subject device over the whole range $0 \leq \alpha \leq 90°$. Thus, there are two sensitivities—the angular sensitivity $S_a$ is maximum when $\alpha_1 = 45$ degrees and when $\alpha_2 = 135$ degrees, and the change in sensitivity $S_A = (R_{45} - R_{135})$ or about twice the resistance when α=45. Thus, the sensitivity of the half Wheatstone bridge device as shown in FIG. 3 is twice that of the device shown in FIG. 1. This is demonstrated in detail in the following descriptions.

Figure 4:
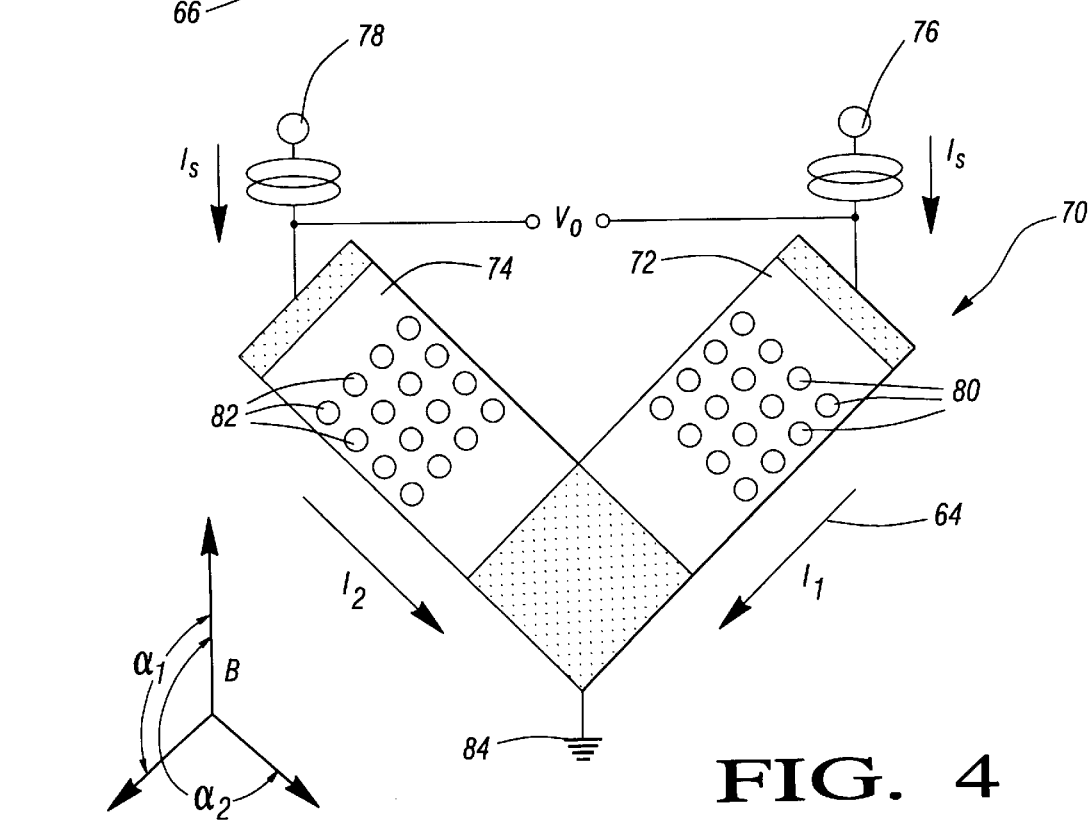
FIG. 4 shows another embodiment of a half Wheatstone bridge differential magnetoresistor suitable as a magnetic field sensor.

FIG. 4 depicts a half Wheatstone bridge device 70, which is structurally the same as device 50 in FIG. 3 except that the two InSb film devices 72 and 74 are connected to matched current sources 76 and 78. The current flow through the films 72 and 74 with their identical antidot patterns 80 and 82 are still perpendicular as shown, and the current paths go to ground 84. This matched current source approach doubles the sensitivity of any voltage divider, and it will double the output voltage imbalance of device 70 as compared to device 50.

Figure 5:
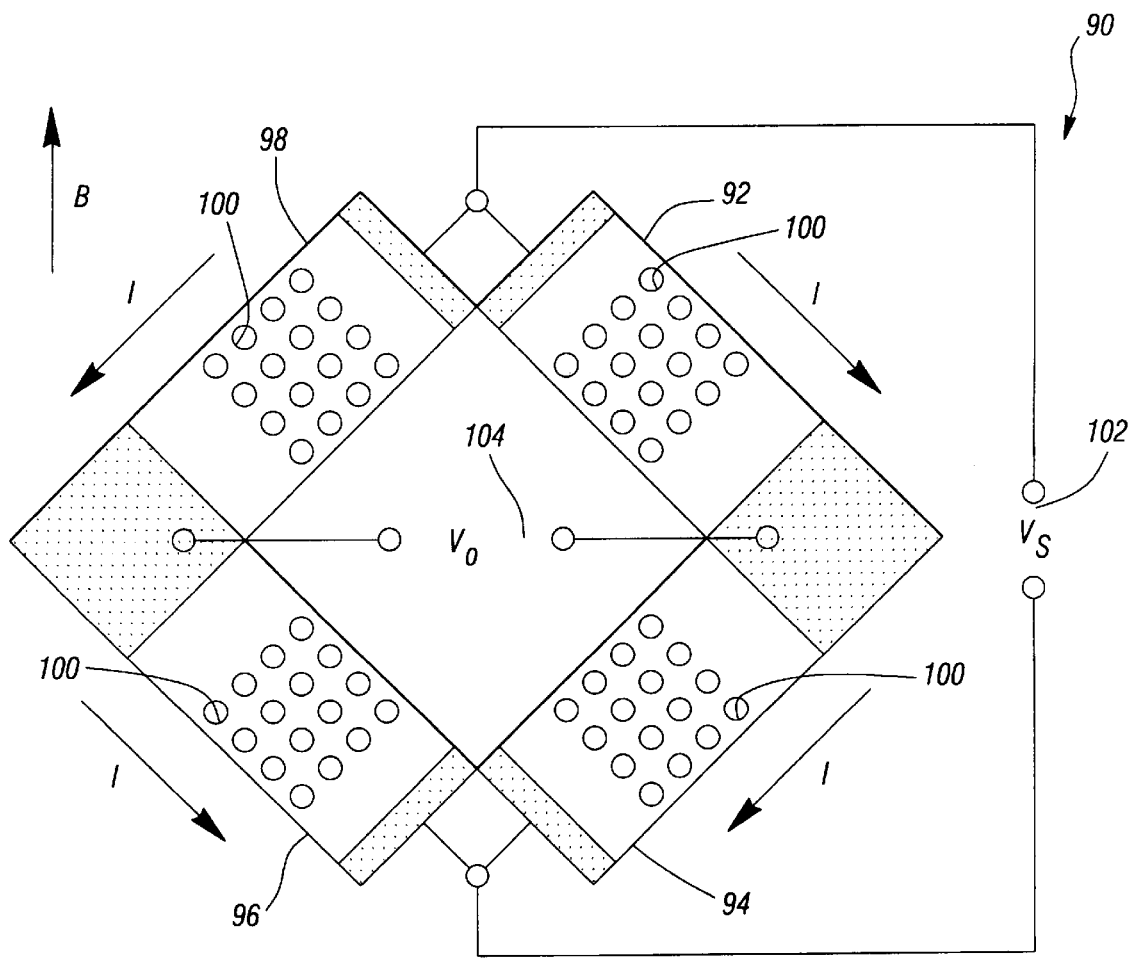
FIG. 5 shows a full Wheatstone bridge magnetoresistor sensor suitable as a magnetic field sensor.

FIG. 5 shows a typical Wheatstone bridge arrangement 90 that utilizes four substantially identical sensing films 92, 94, 96 and 98. Each of the films has an identical antidot pattern 100. The voltage input to the bridge is shown at 102 and the voltage readout is at 104.

The doubling of the sensitivity between the half Wheatstone bridges 10 and 50 in FIGS. 1 and 3, and the influence of the connections 70 and 90 in FIGS. 4 and 5 are demonstrated by the following series of 3 experiments.

Figure 6:
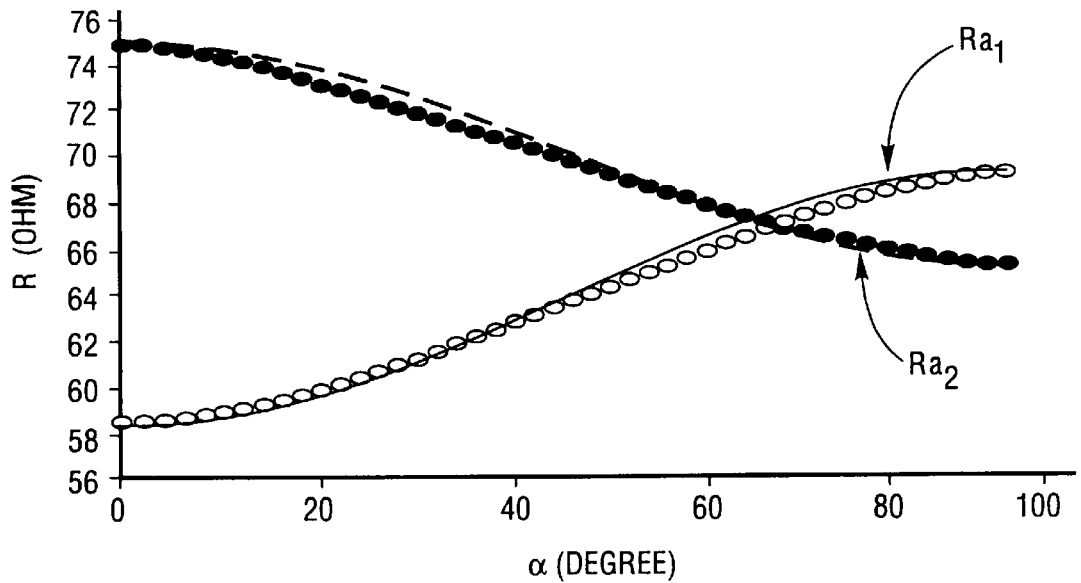
FIG. 6 is a graph of the resistances of each arm of the half bridge shown in FIG. 3, ($R_{a1}$ and $R_{a2}$ in Ohms) as the angle ($\alpha=\alpha_1$) between the direction of the in-plane component of the magnetic field (B) varies with the current ($I_1$) direction. Data is taken at room temperature for $0° \leq \alpha \leq 90°$. The full lines are a model equation fitted to the data.

In the first experiment, contact 60 (of device 50, FIG. 3) was connected to an electrical ground, and a constant current I was supplied to contact 62, so that $I=I_1=I_2$. The voltage between contacts 64 and 60 was measured and divided by I, to yield the resistance value $R_{a1}$. The voltage between contacts 64 and 62 was measured and divided by I, to yield the resistance value $R_{a2}$. FIG. 6 shows the values of $R_{a1}(\alpha)$ and $R_{a2}(\alpha)$, as a function of the angle $\alpha=\alpha_1$ when referred to FIG. 3, for $0 \leq \alpha \leq 90°$. The curves $R_{a1}(\alpha)$ and $R_{a2}(\alpha)$ show less change with α than did the curve $R_a(\alpha)$ in FIG. 2 because the embodiment of FIG. 3 was imperfect: a portion of indium antimonide film without antidots, 50 μm long, had been left between the antidot embedded parts 52 and the contact regions 56, and similarly, a 50 μm long antidot-free length of indium antimonide had been left between the active region 54 and the contact regions 56. These antidot-free parts of the film contribute to the resistance but not to the sensitivity of the device and thus add parasitic resistances in series with the active regions 52 and 54, which accidentally decrease their sensitivities. Nevertheless, the resistance changes can be fitted by the same curves as for the device in FIG. 1:

$$R_{a1}(\alpha) = R_{o1} + A_1 \sin^2(\alpha)$$

and $$R_{a2}(\alpha) = R_{o2} + A_2 \cos^2(\alpha)$$

where $R_{o1} = 58.58$ Ω, $A_1 = 10.93$ Ω, $R_{o2} = 65.41$ Ω, and $A_2 = 9.43$ Ω. In perfect devices, the values of $R_{a1}$ and $R_{a2}$, and of $A_1$ and $R_2$ should be identical; however, imperfections during the device fabrication result in the observed asymmetry.

In the second experiment, three different devices are connected using constant voltage excitation. The three devices are device 10 (FIG. 1), half Wheatstone bridge device 50 (FIG. 3) and full Wheatstone bridge device 90 (FIG. 5).

In device 10, FIG. 1, contact 22 is connected to ground, while a constant voltage source $V_s$ is connected to lead 24. This is labeled Case I in the following equation and the data presented in the graph of FIG. 7. The output voltage $V_{oI}$ is measured between leads 26 and 22. In Case II, FIG. 3, lead 60 of device 50 is connected to ground, and a constant voltage source $V_s$ is connected to lead 62. The output voltage $V_{oII}$ is measured between contacts 64 and 60. In Case III, FIG. 5, a constant voltage source $V_s$ is connected between the top contacts of device 90, as shown (102) and the output voltage $V_{oIII}$ is measured in 104. The following equations give the output voltages for the 3 cases:

$$V_{oI}(\alpha) = V_s \frac{R_o + A \sin^2(\alpha)}{R_u + R_o + A \sin^2(\alpha)}$$

where $R_u$ is the resistance of the unpatterned part of the indium antimonide film 10 between contacts 24 and 26 in FIG. 1. $R_u$ is of the same order of magnitude as $R_o$, though slightly lower because of the absence of antidots. For case II, where the device 50 in FIG. 3 is connected to a constant voltage source, and if the asymmetry between the two arms is neglected ($A=A_1=A_2$ and $r_o=R_{o1}=R_{o2}$), the output voltage is given by:

$$V_{oII}(\alpha) = V_s \frac{R_o + A \sin^2(\alpha)}{2 R_o + A}$$

For case III, the full Wheatstone bridge 90 shown in FIG. 5, again neglecting asymmetries:

$$V_{oIII}(\alpha) = V_s \frac{A[\sin^2(\alpha) - \cos^2(\alpha)]}{2 R_o + A}$$

When the angle $\alpha$ is modulated by an amount $0 \leq \alpha \leq \alpha_{mod}$, the total variation of the output voltages $\delta V_o$ are given by:

$$\delta V_o = V_o(\alpha_{mod}) - V_o(0),$$

which works out to be, for the three cases (I, II and III):

$$\delta V_{oI}(\alpha_{mod}) = V_s \left[ \frac{R_o + A \sin^2(\alpha_{mod})}{R_u + R_o + A \sin^2(\alpha)} - \frac{R_o}{R_u + R_o} \right]$$

$$\delta V_{oII}(\alpha_{mod}) = V_s \frac{A \sin^2(\alpha_{mod})}{2 R_o + A}$$

and $$\delta V_{oIII}(\alpha_{mod}) = V_s \frac{2 A \sin^2(\alpha_{mod})}{2 R_o + A}$$

Figure 7:
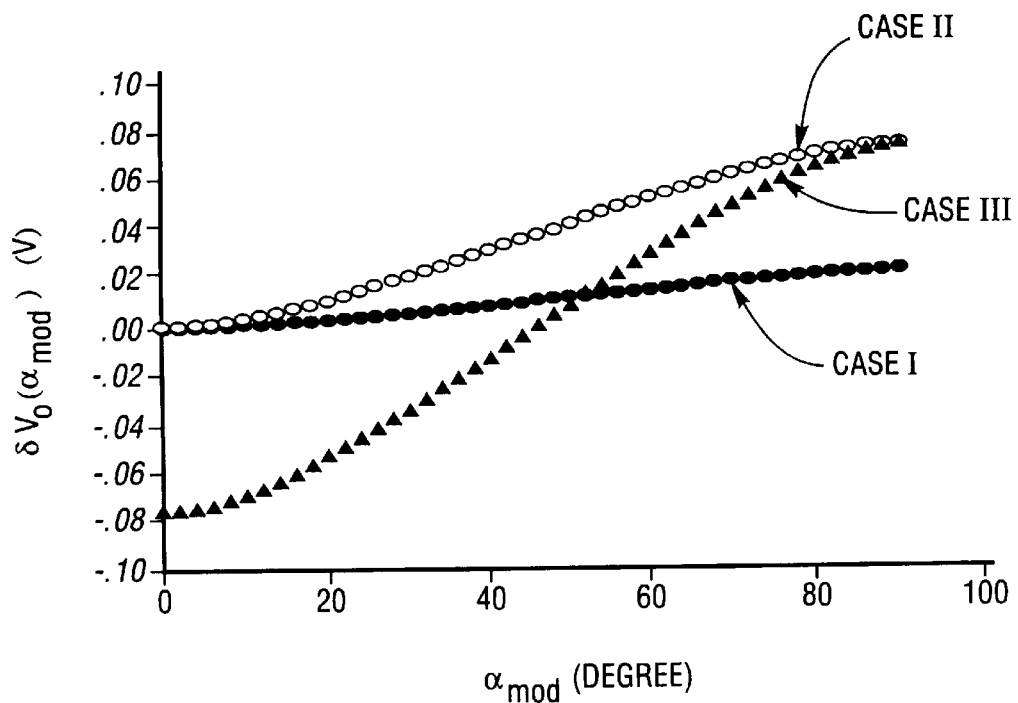
FIG. 7 is a graph showing the sensitivity of the change in voltage with change in magnetic field direction ($\alpha$) of a one-armed semiconductor bridge like that depicted in FIG. 1 (Case I, -●-) as compared with the half bridge sensor depicted in FIG. 3 (Case II, -○-) and the full Wheatstone bridge depicted in FIG. 5 (Case III, -▲-).

Experimentally measured values of $\delta V_{oI}(\alpha_{mod})$, $\delta V_{oII}(\alpha_{mod})$ and $\delta V_{oII}(\alpha_{mod})$ as a function of the angle $\alpha_{mod}$ are shown in FIG. 7. Data were taken at room temperature and with a magnetic field at a level of 2 Tesla. It is clearly seen in FIG. 7 that $\delta V_{oII}(\alpha_{mod})$ (Case II) > $\delta V_{oI}(\alpha_{mod})$ (Case I) by a factor of over two. The experimental value of the improvement factor $\delta V_{oII}(\alpha_{mod})/\delta V_{oI}(\alpha_{mod})$ is strongly influenced by the details of the sample fabrication and, in particular, by the values of the parasitic series resistances and of $R_u$. However, from the equations above, one can see that an improvement of $\delta V_{oII}(\alpha_{mod})/\delta V_{oI}(\alpha_{mod}) > 2$ is reasonable when the half bridge is nearly balanced ($R_u \approx R_o$). The use of a full Wheatstone bridge (Case III) over the use of a half bridge (Case II) results formally in an additional improvement (FIG. 7) by a factor that is rigorously 2, as is well known: $\delta V_{oIII}(\alpha_{mod})/\delta V_{oII}(\alpha_{mod}) = 2$.

In the third experiment, the three devices 10, 70 and 90 are connected to constant current sources. This is achieved as follows. In FIG. 1, contact 22 of device 10 is connected to ground, contact 24 is connected to a current source supplying a current $I_s$, and the voltage across 26 and 22 is monitored. By developing a series of equations analogous to the case above, the output voltage modulation amplitude is given by:

$$\delta V_{oI}(\alpha_{mod}) = I_s A \sin^2(\alpha_{mod}).$$

In the second case, the half Wheatstone bridge 70 is connected to two matched current sources as shown in FIG. 4, each current source supplying a current $I_s$. The output voltage modulation is then:

$$\delta V_{oII}(\alpha_{mod}) = 2 I_s A \sin^2(\alpha_{mod}).$$

The full Wheatstone bridge 90 (FIG. 5) can also be connected to one single constant current source instead of a voltage source at location 102. The output voltage modulation is then again:

$$\delta V_{oIII}(\alpha_{mod}) = 2 I_s A \sin^2(\alpha_{mod})$$

Under constant current excitation, the half Wheatstone bridge 70 (FIG. 4) gives an improvement by a factor of rigorously two over the device FIG. 1; however, unlike the situation under constant voltage excitation, no further improvement is obtained by using a full Wheatstone bridge.

The bridge configurations 50 under constant voltage excitation, 70 and 90 compensate for temperature drift and strain as long as these factors are uniform within the device.

While the invention has been described in terms of preferred embodiments thereof, it will be appreciated that other forms could readily be adapted by those skilled in the art. Accordingly, the scope of the invention is to be considered limited only by the following claims.

What is claimed is:

1. A magnetic field sensor comprising at least first and second coplanar thin film n-doped semiconductors carried on a substrate, comprising:

electrically conductive leads for directing a first current in a first direction through said first semiconductor and a second current in a second direction perpendicular to said first direction through said second semiconductor and electrical contacts for measuring the voltages across said semiconductors in their respective directions of current flow, said first and second semiconductors being in electrical communication with each other, each semiconductor comprising a plurality of antidots whereby the electrical resistance of said first and second thin film semiconductors vary with respect to the direction of a magnetic field component lying in the plane of said semiconductors, the semiconductors meeting at a junction electrically connected to ground.

2. A magnetic field sensor as recited in claim 1 in which the first and second thin film semiconductors are identical including the arrangement of antidots.

3. A magnetic field sensor as recited in claim 1 in which the current flow through each of said semiconductors is equivalent.

4. A magnetic field sensor as recited in claim 1 in which said semiconductor films are n-doped indium antimonide semiconductor films.

5. A magnetic field sensor as recited in claim 1 in which said antidots are cylindrical holes in said films.

6. A magnetic field sensor as recited in claim 4 in which the thickness of the indium antimonide film is in the range of 0.1 to 5.0 micrometers.

7. A magnetic field sensor as recited in claim 1 in which the electrical leads are such that said first and second semiconductor films are arranged in a half Wheatstone bridge electrical circuit.

8. A magnetic field sensor as recited in claim 7 in which said first and second semiconductor films are connected to matched current sources.

9. A magnetic field sensor as recited in claim 1 in which two sets of first and second semiconductor films are employed and the electrical conductive leads are arranged such that said first and second sets of coplanar sensors are arranged in a Wheatstone bridge circuit.

10. A magnetic field sensor as recited in any of claims 1, or 2, or 3, or 4, or 5, or 6, or 7, or 8, or 9 in which said first and second semiconductors each comprise a plurality of antidots in patterns that extend over the entirety of the regions of said semiconductors with respect to which electrical resistance characterizing measurements are to be made.

* * * * *